United States Patent [19]

Miyashita

[11] Patent Number: 4,864,373
[45] Date of Patent: Sep. 5, 1989

[54] SEMICONDUCTOR CIRCUIT DEVICE WITH VOLTAGE CLAMP

[75] Inventor: Takumi Miyashita, Tokyo, Japan
[73] Assignee: Fujitsu Limited, Kawasaki, Japan
[21] Appl. No.: 283,824
[22] Filed: Dec. 13, 1988

Related U.S. Application Data

[63] Continuation of Ser. No. 818,977, Jan. 15, 1986, abandoned.

[30] Foreign Application Priority Data

Jan. 16, 1985 [JP] Japan ................................ 60-005333

[51] Int. Cl.⁴ .......................................... H01L 29/78
[52] U.S. Cl. ................................ 357/23.5; 357/40; 357/41; 357/42; 307/304; 307/296.2
[58] Field of Search ................... 357/23.5, 40, 41, 42, 357/51; 307/304, 298 R, 297

[56] References Cited

U.S. PATENT DOCUMENTS 3,794,862  2/1974  Jenne ..................................... 307/304
4,062,039  12/1977  Nishimura ......................... 357/41 X
4,628,214  12/1986  Leuschner ...................... 307/304 X
4,631,421  12/1986  Inoue et al. ......................... 357/41 X

FOREIGN PATENT DOCUMENTS 0024903  3/1981  European Pat. Off. .

57-39566  3/1982  Japan .

OTHER PUBLICATIONS

Chan et al., "A 100 ns 5V Only 64K×1 MOS Dynamic RAM," *IEEE Jour. of Solid-State Circuits*, vol. SC-15, (1980), Oct., No. 5, pp. 839-846.
Patent Abstracts of Japan, vol. 6, No. 107, Jun. 17, 1982, 57-39566, by Hirahara.

*Primary Examiner*—Rolf Hille
*Assistant Examiner*—William A. Mintel
*Attorney, Agent, or Firm*—Staas & Halsey

[57] ABSTRACT

A semiconductor circuit device includes a semiconductor substrate, a plurality of metal oxide semiconductor (MOS) transistors formed on the semiconductor substrate and a plurality of ground side power source lines formed on the semiconductor substrate. A back gate bias generating circuit is formed between the substrate and the ground side power source lines and supplies a back gate voltage to the substrate. A clamp circuit is provided, which includes an MOS diode formed on the substrate and is connected between the substrate and the ground side power source line. The clamp circuit clamps the potential of the substrate to a predetermined level when the back gate bias generating circuit is not operated.

6 Claims, 12 Drawing Sheets

SEMICONDUCTOR CIRCUIT DEVICE WITH VOLTAGE CLAMP

"This is a continuation of co-pending application Ser. No. 818,977 filed on 1/15/86, now abandoned."

BACKGROUND OF THE INVENTION

1. Field of the Invention

The present invention relates to a semiconductor circuit device formed by a plurality of metal oxide semiconductor (MOS) transistors. More particularly, it relates to a large scale integrated circuit (LSI) having a circuit structure which prevents bonding pads on the MOS LSI chip from being subjected to an electrolytic corrosion action caused by moisture or the water content of the atmosphere.

2. Description of the Related Art

As is well-known, an N-channel MOS transistor is, in general, formed by a p-type substrate, n+ diffusion regions formed in the substrate, and aluminum (A1) electrodes. These electrodes are connected to input or output pads (A1 pads) on a semiconductor chip. In this case, generally one end of a gold wire is bonded to the A1 pad and the other end of the gold wire is connected to an external terminal of a lead frame of the LSI package which encapsulates the semiconductor chip.

In an LSI chip, particularly an LSI chip formed by a plastic package, when moisture or the water content of the atmosphere sinks into the LSI chip through a very narrow gap between the plastic mold and the lead frame, a kind of "battery" is formed between the bonding pad (anode side) and the substrate electrode or the LSI chip stage (cathode side) based on a difference in the tendency toward ionization caused by the moisture or water content acting as an electrolyte. In this case, since a large current flows from the p-type substrate to the bonding pad through the n+ diffusion region, the bonding pad is gradually corroded by this large current caused by the "battery". Consequently, contact faults occur between the gold wire and the bonding pad.

Moreover, this electrolytic corrosion action frequently occurs in an MOS transistor type that is activated by a back gate voltage applied to the substrate. This is because the substrate potential gradually rises when the back gate voltage is cut off, so that the threshold voltage of the MOS transistor rises and the input/output MOS transistor for preventing electrostatic breakdown is turned on. This results in a large electrolytic corrosion current flowing from the substrate to the bonding pad.

SUMMARY OF THE INVENTION

The object of the present invention is to provide a semiconductor circuit device having a circuit structure which prevents bonding pads from being subjected to an electrolytic corrosion action caused by moisture or water content of the atmosphere.

In accordance with the present invention, there is provided a semiconductor circuit device comprising a semiconductor substrate, a plurality of metal oxide semiconductor (MOS) transistors formed on the semiconductor substrate and a plurality of ground side power source lines formed on the semiconductor substrate. In addition, a back gate bias generating circuit, formed between the substrate and the ground side power source line, for supplying a back gate voltage to the substrate is provided. A clamp circuit including a MOS diode formed on the substrate is provided between the substrate and the ground side power source line, for clamping a potential of the substrate to a predetermined level when the back gate bias generating circuit is not operated.

DESCRIPTION OF THE PREFERRED EMBODIMENTS

Before describing the preferred embodiments, an explanation will be given of a conventional semiconductor circuit device formed by a plurality of MOS transistors.

Figure 1:
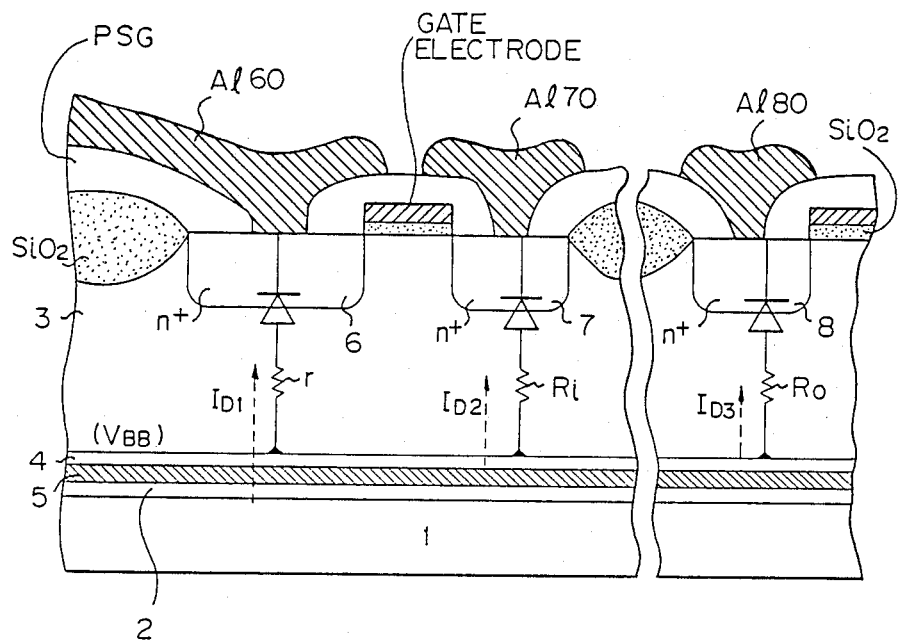
FIG. 1 is a sectional view of a conventional semiconductor circuit device.

Referring to FIG. 1, reference number 1 is a stage of a lead frame, 2 is a gold (Au) plating layer on stage 1, 3 is a p-type silicon (Si) substrate, 4 is a substrate electrode having a Au evaporation layer, and 5 is a Su-Si solder for bonding the chip 3 to the stage 1. Reference numbers 6, 7, and 8 are n+ $^l$ diffusion regions.

Figure 2:
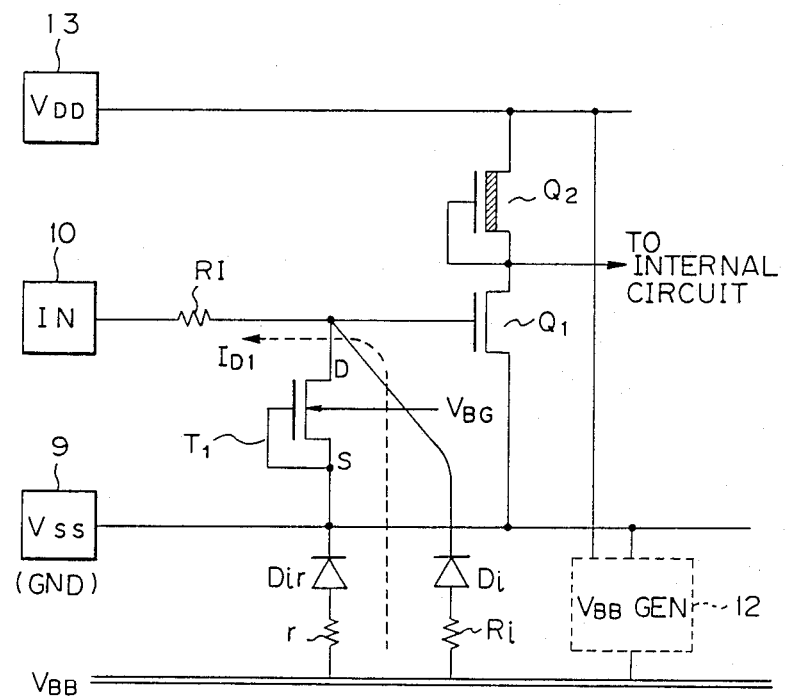
FIG. 2 is a typical input circuit of a conventional MOS transistor circuit.

As is well-known, aluminum electrodes 60, 70, and 80 are provided on the n+ diffusion regions 6, 7, and 8 and gate electrodes are provided on the silicon oxide film (SiO$_2$) shown by a dotted area. In FIG. 2, the aluminum layer 60 is a ground wiring for supplying the ground voltage to the inner circuit, and generally, the n+ diffusion region 6 connected to the ground wiring is large enough to allow a large current to flow therein. On the other hand, the other n+ diffusion regions 7, 8 are relatively small regions which are connected to the aluminum electrodes 70 and 80, for example. In the p-n junction shown in FIG. 1, an internal resistance r in the substrate 3 is relatively small (about several tens of ohms) because the corresponding p-n junction area is wide, as shown by reference number 6. The other internal resistance $R_i(R_O)$ is large (about several hundreds of ohms) because the corresponding p-n junction area is narrower than that of the resistance r. Accordingly, a large electrolytic corrosion current $I_{D1}$ flows from the substrate electrode 4 or Au plating layer 2 to the bonding pad (see FIG. 2) connected to the Al electrode through the p-type substrate 3 and n+ diffusion region 6. The other electrolytic corrosion currents $I_{D2}$ and $I_{D3}$ also flow, but these currents are so small that they are considered to be negligible. The electrolytic corrosion current will be explained in detail with reference to FIGS. 2 and 3.

Figure 3:
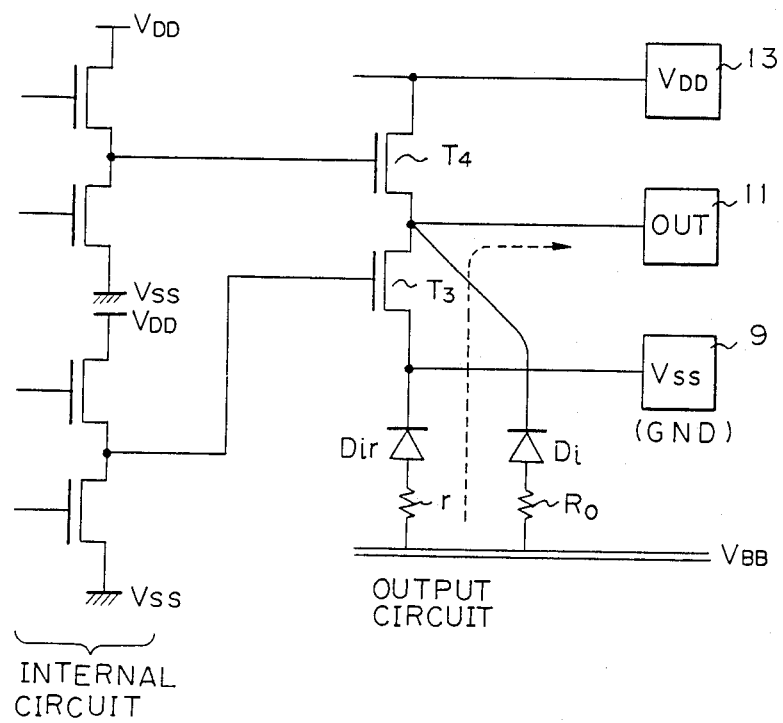
FIG. 3 is a typical output circuit of a conventional MOS transistor circuit.

In FIGS. 2 and 3, reference number 9 is a bonding pad for a second power source $V_{SS}$ (usually, ground potential), 10 is a bonding pad for an input signal, 11 a bonding pad for an output signal, 12 is a back gate bias generating circuit $V_{BB}$ GEN for supplying a reference voltage $V_{BB}$ to the substrate 3 in FIG. 1, and 13 is a bonding pad for a first power source $V_{DD}$. A protection transistor $T_1$ is provided for preventing electrostatic breakdown. The source region of the transistor $T_1$ corresponds to the n+ diffusion region 6 in FIG. 1 since the source region is connected to the $V_{SS}$ pad 9. The drain region of the transistor $Y_1$ corresponds to the n+ diffusion region 7 in FIG. 1. $Q_1$ and $Q_2$ are input transistors. The output of this circuit is supplied to an internal circuit (not shown). The back gate bias generating circuit $V_{BB}$ GEN supplies the substrate potential (usually, a minus voltage) against ground (GND) $V_{SS}$ for proper operation of the MOS transistors. The detailed circuit of $V_{BB}$ GEN is shown in FIG. 4.

Figure 4:
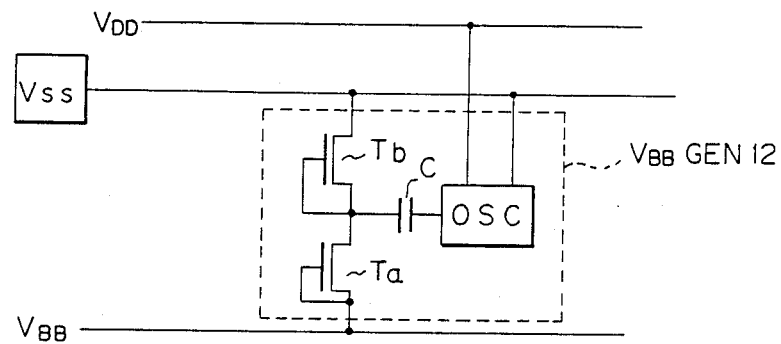
FIG. 4 is a conventional back gate bias generating circuit.

As shown in FIG. 4, this circuit operates as a so-called charge pump. That is, when the first power source $V_{DD}$ is supplied to the $V_{BB}$ GEN, an oscillator generates a pulse to a capacitor C so that the charges in the substrate are always pulled to the capacitor C through the transistor $T_a$. The charges in the capacitor C are always supplied to ground $V_{SS}$. Consequently, when $V_{DD}$ is supplied, the substrate potential $V_{BB}$ is maintained at the predetermined constant minus voltage as the reference value.

Problems arise, however, when the first power source $V_{DD}$ is cut OFF, and thus the circuit $V_{BB}$ GEN is rendered inoperative. That is, when the circuit $V_{BB}$ GEN does not operate, the substrate potential $V_{BB}$ gradually rises because the substrate is in a floating state and the charges in the substrate cannot be pulled out therefrom. Accordingly, the back gate voltage $V_{BG}$ of the MOS transistor $T_1$ is raised, so that the threshold level of the MOS transistor becomes low, and then the transistor $T_1$ is turned ON. Consequently, the large electrolytic corrosion current $I_{D1}$ flows from the substrate 3 to the input pad 10 through the internal resistance r, the junction diode Dir, and the protection transistor $T_1$ (see FIG. 2). This corrosion current causes a gradual corrosion of the bonding pad which destroys the contact between the pad and the wire. In FIG. 3, similarly, the output transistor $T_3$ is turned ON so that the large electrolytic corrosion current flows from the substrate 3 to the output pad 11 through the internal resistance r, the junction diode Dir, and the output transistor $T_3$, causing a gradual corrosion of the output pad.

A semiconductor circuit device according to an embodiment of the present invention will be explained in detail below.

Figure 5:
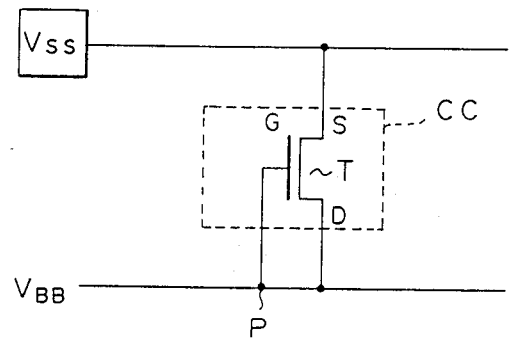
FIG. 5 is a clamp circuit according to an embodiment of the present invention.

FIG. 5 is a clamp circuit according to an embodiment of the present invention. Referring to FIG. 5, a clamp circuit CC comprises only one MOS transistor T (MOS diode) having a source S connected to the ground $V_{SS}$ and a gate G and drain D connected to the substrate at point P.

When the back gate bias generating circuit $V_{BB}$ GEN shown in FIG. 4 is operated, this clamp circuit CC is not activated because the substrate potential $V_{BB}$ is maintained at a lower level than the ground potential $V_{SS}$, so the transistor T is cut OFF.

When the back gate bias circuit $V_{BB}$ GEN does not operate, the substrate potential $V_{BB}$ gradually rises so that the transistor T is turned ON, because the gate voltage of the transistor T becomes high and the threshold level becomes relatively low. Accordingly, the $V_{SS}$ and $V_{BB}$ are short-circuited through the transistor T so that the voltage $V_{SS}$ becomes almost equivalent to the voltage $V_{BB}$. In this case, the protection transistor $T_1$ is not turned ON because the threshold voltage of transistor $T_1$ is maintained at a relatively high level. Therefore, the electrolytic corrosion current $I_{D1}$ shown in FIG. 2 no longer flows from the substrate to the bonding pad 10.

Figure 6:
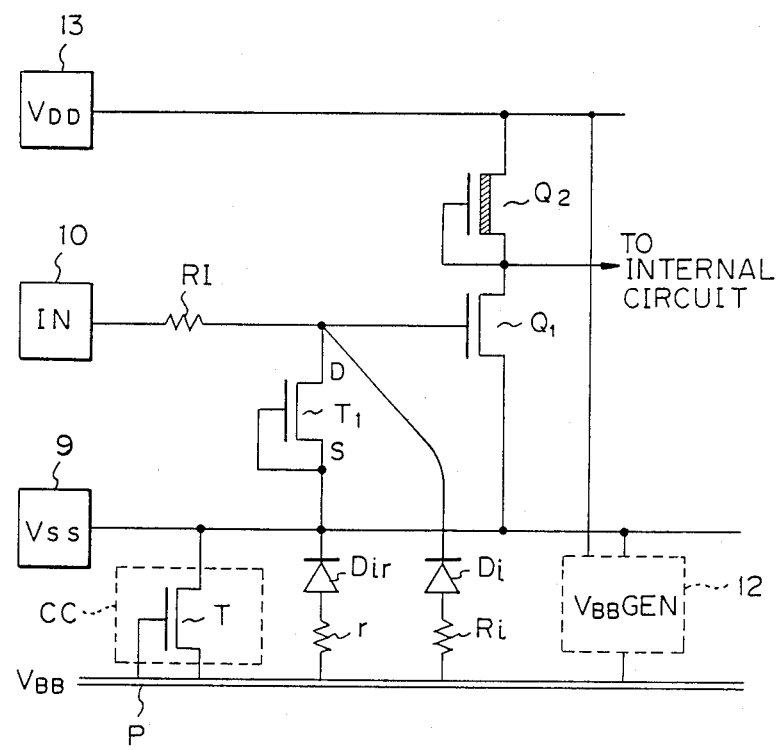
FIG. 6 is an input circuit having a clamp circuit as shown in FIG. 5.

Referring to FIG. 6, the clamp circuit CC including MOS diode is provided between the ground $V_{SS}$ and the substrate $V_{BB}$. Accordingly, when the back gate bias circuit $V_{BB}$ GEN does not operate, since the clamp circuit CC begins to operate, the electrolytic corrosion current no longer flows because the substrate voltage $V_{BB}$ becomes approximately equal to the ground voltage $V_{SS}$.

Figure 7:
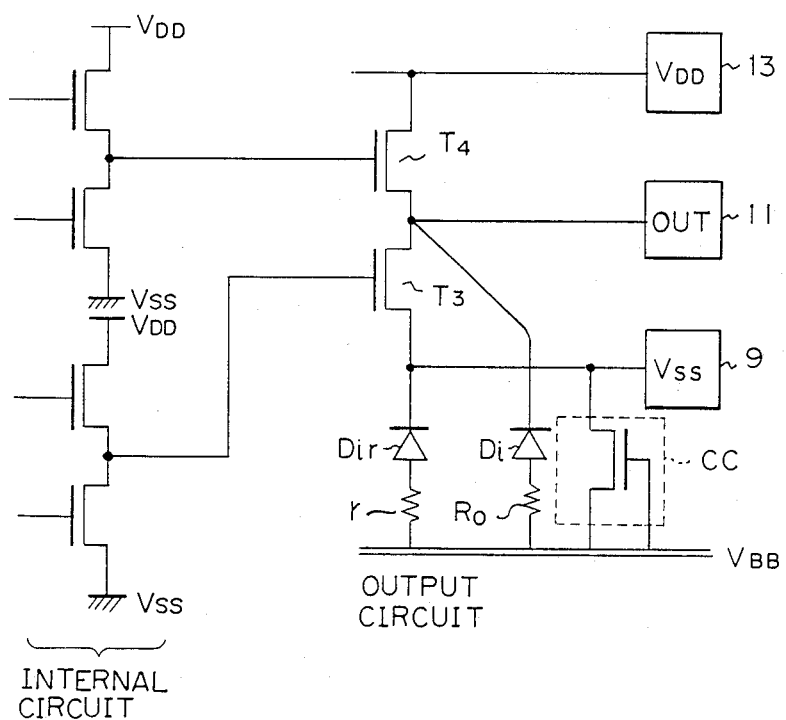
FIG. 7 is an output circuit having a clamp circuit as shown in FIG. 5.

Referring to FIG. 7, since the clamp circuit CC is already provided for in the input circuit, the electrolytic corrosion current does not flow from the substrate to the output pad 11.

Figure 8A:
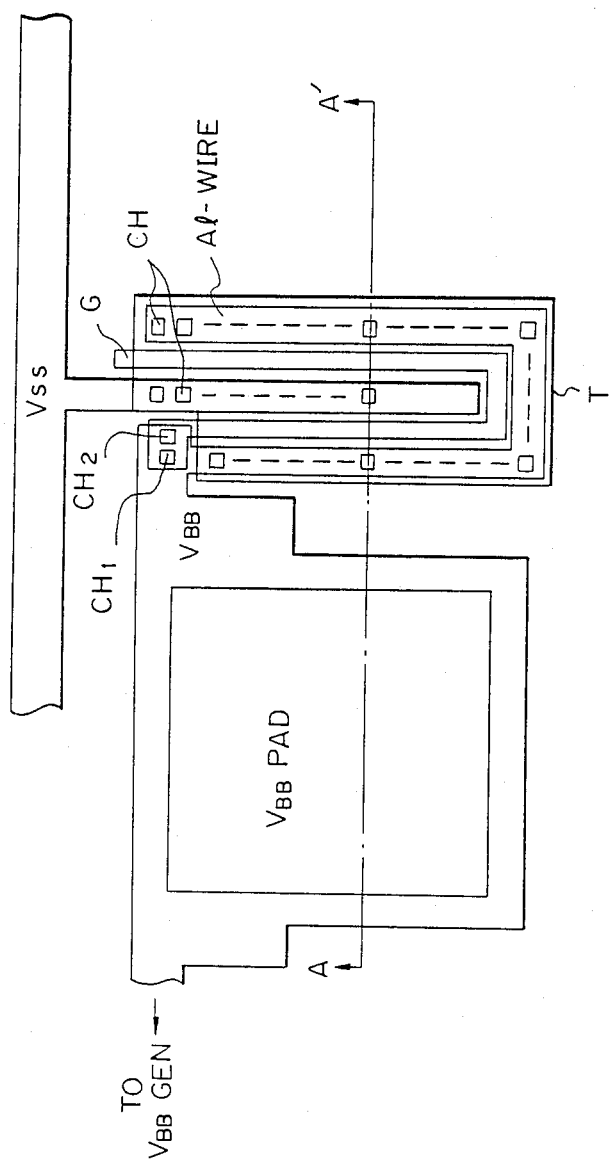
FIG. 8A is a plan view of a clamp circuit according to an embodiment of the present invention.
Figure 8B:
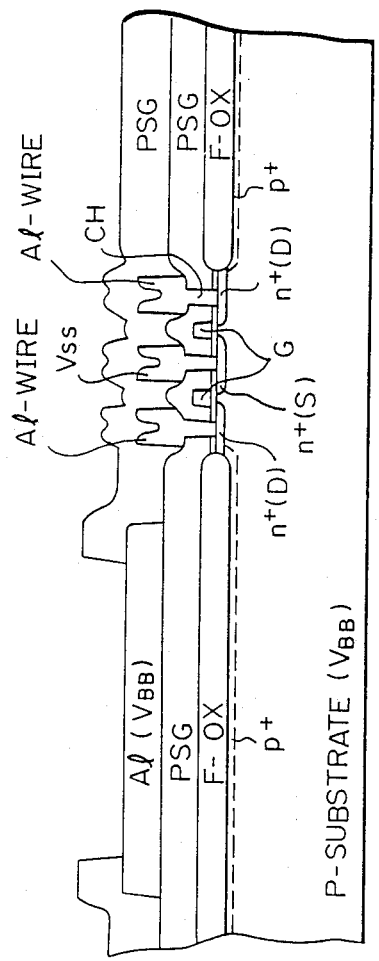
FIG. 8B is a sectional view taken along the line A—A' of FIG. 8A.

FIG. 8A is a plan view of a clamp circuit including the MOS diode T in FIG. 5 according to an embodiment of the present invention. FIG. 8B is a sectional view taken along the line A—A' of FIG. 8A. In FIGS. 8A and 8B, G is a gate of the transistor T, n+ $^{1\,(D)\,is\,a}$ drain of the transistor T formed in the n+ diffusion region, and n+ (S) is a source of the transistor T formed in the n+ diffusion region. CH are contact holes for connecting between the Al electrode wires ($V_{BB}$ and $V_{SS}$) and the n+ diffusion region or the gate of the transistor. PSG is a phosphor-silicate glass layer, and F-OX is a field oxide layer.

In FIG. 8A, the contact holes $CH_1$ and $CH_2$ are used for connecting the substrate voltage aluminum layer $V_{BB}$ and the gate of the transistor T. That is, the contact point P shown in FIG. 5 is formed by the contact holes $CH_1$ and $CH_2$.

Figure 9A:
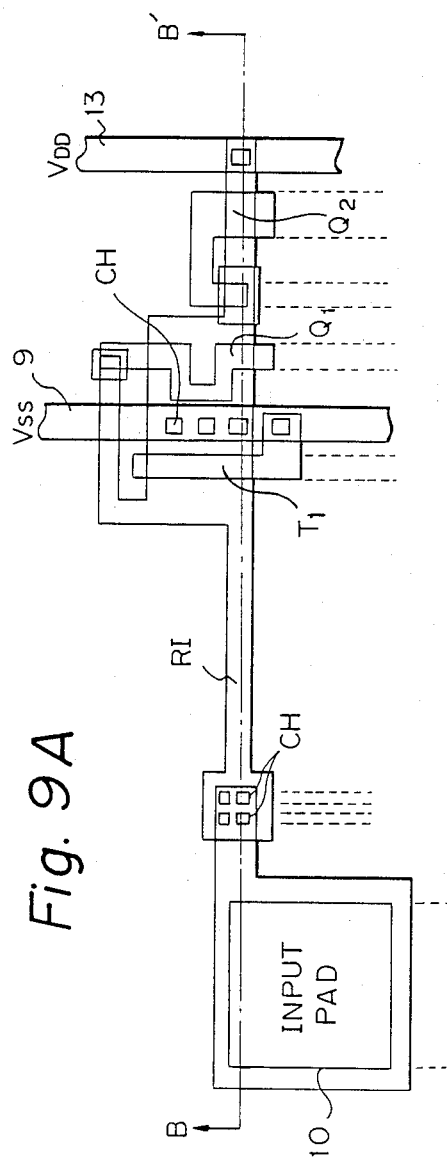
FIG. 9A is a plan view of an input circuit according to an embodiment of the present invention.
Figure 9B:
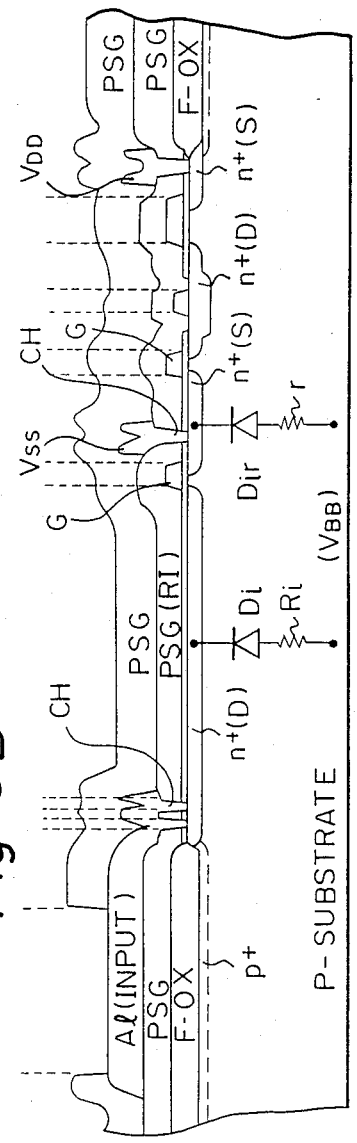
FIG. 9B is a sectional view taken along the line B—B' of FIG. 9A.

FIG. 9A is a plan view of input circuits based on FIG. 6 according to an embodiment of the present invention. FIG. 9B is a sectional view taken along the line B—B' of FIG. 9A. Although the clamp circuit CC is not shown in FIG. 9A, FIGS. 8A and 9A are combined with each other through the ground wiring $V_{SS}$, as is obvious from the circuit shown in FIG. 6.

Figure 10A:
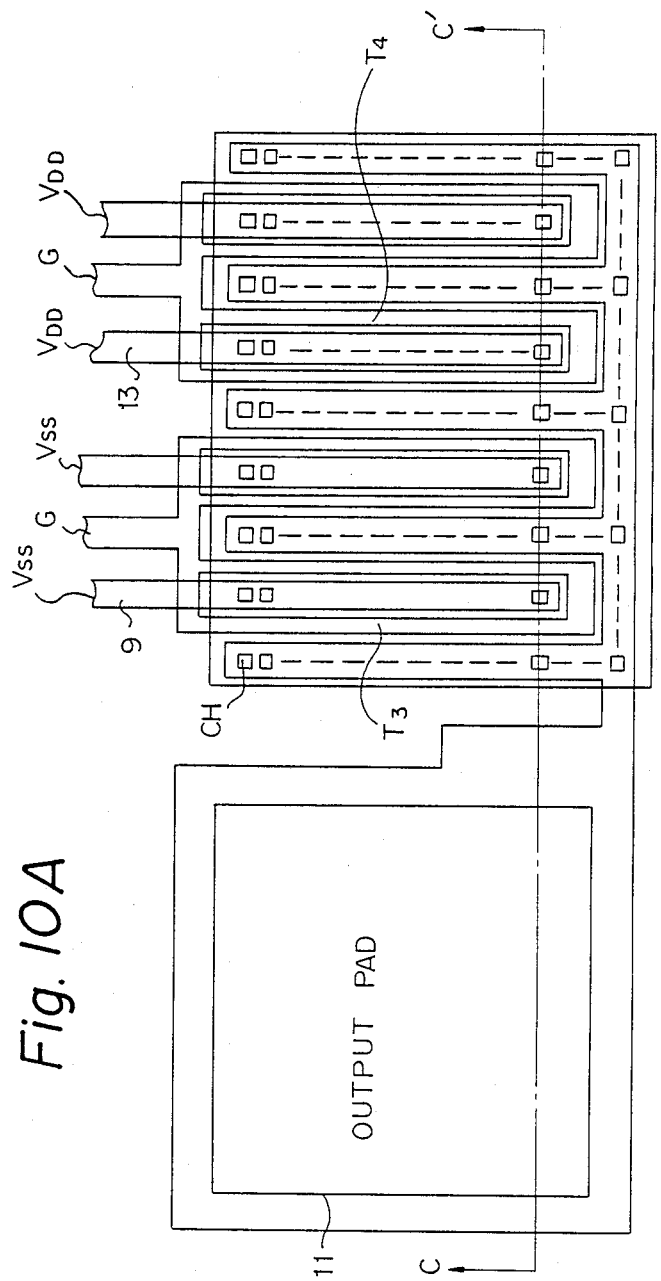
FIG. 10A is a plan view of an output circuit according to an embodiment of the present invention.
Figure 10B:
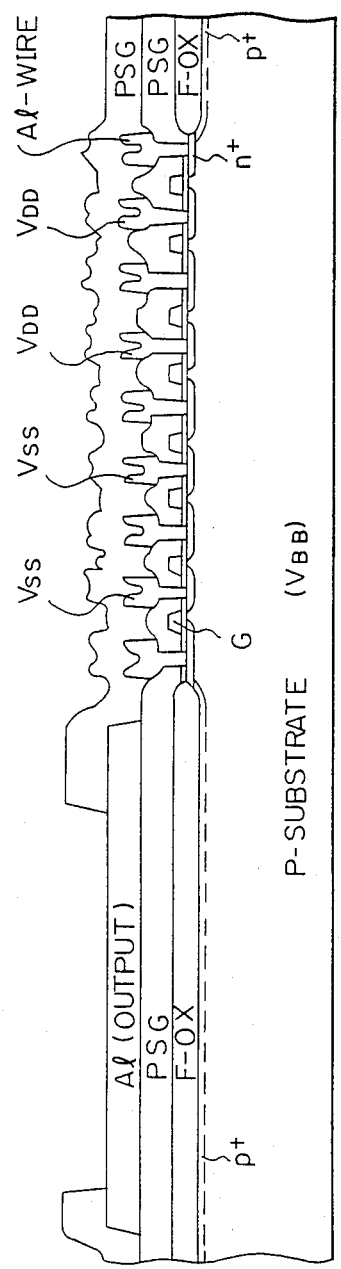
FIG. 10B is a sectional view taken along the line C—C' of FIG. 10A.

FIG. 10A is a plan view of output circuits shown in FIG. 7 according to an embodiment of the present invention. FIG. 10B is a sectional view taken along the line C—C' of FIG. 10A.

As is obvious from FIGS. 8A to 10A, the semiconductor circuit device according to an embodiment of the present invention is formed by a combination of the circuits shown in FIGS. 8A to 10A. In this case, an internal circuit (not shown) is omitted because an arbitrary internal circuit can be connected between the input circuit and the output circuit.

Figure 11:
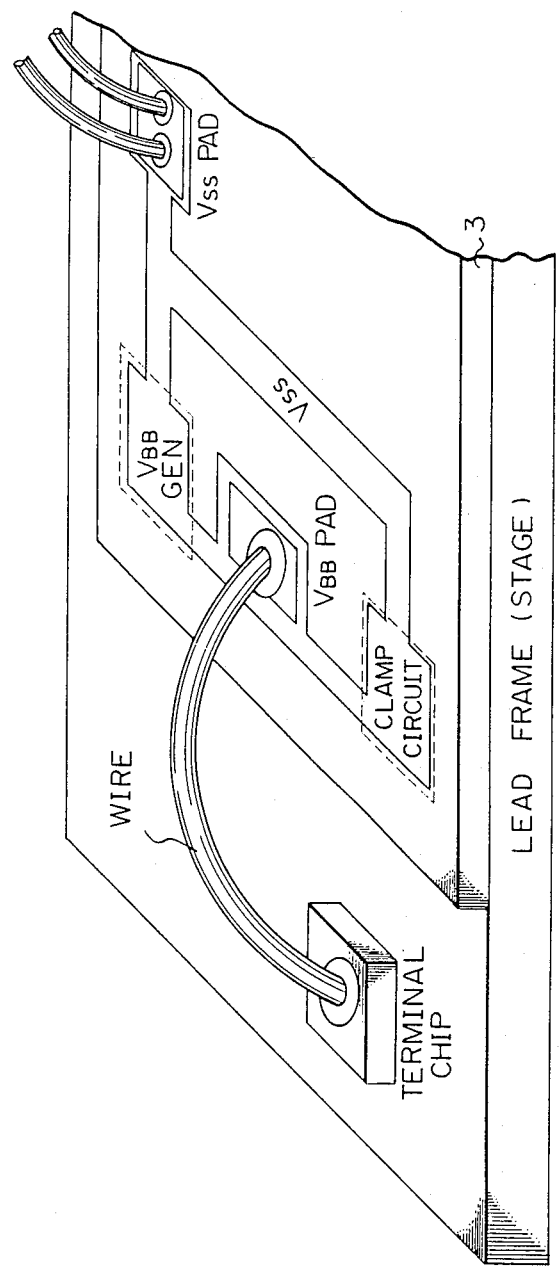
FIG. 11 is a perspective partial view of the semiconductor circuit device according to an embodiment of the present invention.

FIG. 11 is a perspective view of the structure between the $V_{BB}$ pad and the terminal chip. The $V_{BB}$ pad is connected to the terminal chip by a gold wire. The ground wiring $V_{SS}$ on the substrate 3 is connected by way of the $V_{SS}$ pad to the clamp circuit and to the back gate bias circuit $V_{BB}$ GEN. In FIG. 11, the back gate voltage $V_{BB}$ generated by the circuit $V_{BB}$ GEN is provided through the terminal chip which connects the lead frame stage and the $V_{BB}$ bonding pad on the substrate 3. In another embodiment, the output of the back gate bias circuit $V_{BB}$ GEN is provided directly to the substrate 3 through a well known structure.

I claim:

1. A semiconductor circuit device comprising:
   a semiconductor substrate;
   a plurality of metal oxide semiconductor (MOS) transistors formed on said semiconductor substrate;
   a plurality of ground side power source lines formed on said semiconductor substrate;
   a back gate bias generating circuit, formed between said semiconductor substrate and said ground side power source lines, for supplying a back gate voltage to said semiconductor substrate; and
   a clamp circuit including an MOS diode formed between said semiconductor substrate and one of said ground side power source lines and connected to said semiconductor substrate and one of said ground side power source lines, said MOS diode turning ON when the potential of said semiconductor substrate exceeds the potential on said ground side power source lines, a current flowing from said semiconductor substrate to said ground side power source lines for clamping a potential of said semiconductor substrate to a predetermined level when said back gate bias generating circuit is not operated.

2. A semiconductor circuit device as claimed in claim 1, wherein said ground side power source lines are supplied with ground potential.

3. A semiconductor circuit device comprising:
   a substrate having a potential;
   back gate bias generating means, formed on said substrate, for supplying a back gate voltage to said substrate;
   a first bonding pad, formed on said substrate, for receiving a first power source voltage;
   a second bonding pad, formed on said substrate, for receiving a second power source voltage, said first power source voltage being greater than said second power source voltage; and
   clamping means, formed in said substrate and connected between said second bonding pad and said back gate bias generating means, turning ON when the potential of said substrate exceeds that of the second bonding pad, a current flowing from said substrate to said second bonding pad for clamping the potential of said substrate to a predetermined level when said back gate bias generating means is inoperative.

4. A semiconductor device according to claim 3, wherein said clamping means comprises an MOS diode.

5. A semiconductor device according to claim 3, wherein said second power source voltage is ground level.

6. A semiconductor circuit device comprising:
   a semiconductor substrate;
   a plurality of metal oxide semiconductor (MOS) transistors formed on said semiconductor substrate;
   a plurality of ground side power source lines formed on said semiconductor substrate;
   a back gate bias generating circuit, formed between said semiconductor substrate and said ground side power source lines, for supplying a back gate voltage to said semiconductor substrate; and
   a clamp circuit including an MOS diode comprising an MOS transistor having a source connected to the ground source power supply lines, having a gate, and having a drain, said gate and said drain being connected to said semiconductor substrate, said MOS diode turning ON when the potential of said semiconductor substrate exceeds the potential on said ground side power source lines, a current flowing from said semiconductor substrate to said ground side power source lines for clamping a potential of said semiconductor substrate to a predetermined level when said back gate bias generating circuit is not operated.

* * * * *

UNITED STATES PATENT AND TRADEMARK OFFICE
CERTIFICATE OF CORRECTION

PATENT NO. : 4,864,373
DATED : SEPTEMBER 5, 1989
INVENTOR(S) : TAKUMI MIYASHITA

It is certified that error appears in the above-identified patent and that said Letters Patent is hereby corrected as shown below:

Col. 2, line 47, "Su" should be --Au--.

Col. 3, line 20, "$Y_1$" should be --$T_1$--.

Col. 4, line 35, "$n^{+1}(D)$ is a" should be --$n^{+}(D)$ is a--.

Signed and Sealed this

Fourth Day of May, 1993

Attest:

MICHAEL K. KIRK

*Attesting Officer*   Acting Commissioner of Patents and Trademarks